(12) United States Patent
Christie

(10) Patent No.: US 6,808,607 B2
(45) Date of Patent: Oct. 26, 2004

(54) HIGH PEAK POWER PLASMA PULSED SUPPLY WITH ARC HANDLING

(75) Inventor: David J. Christie, Fort Collins, CO (US)

(73) Assignee: Advanced Energy Industries, Inc., Fort Collins, CO (US)

(*) Notice: Subject to any disclaimer, the term of this patent is extended or adjusted under 35 U.S.C. 154(b) by 91 days.

(21) Appl. No.: 10/254,158

(22) Filed: Sep. 25, 2002

(65) Prior Publication Data

US 2004/0055881 A1 Mar. 25, 2004

(51) Int. Cl.[7] .................................. C23C 14/34
(52) U.S. Cl. .................... 204/298.08; 204/298.06; 204/192.12
(58) Field of Search .............. 204/298.08, 192.12, 204/298.06

(56) References Cited

U.S. PATENT DOCUMENTS

| | | | |
|---|---|---|---|
| 5,241,152 A | * 8/1993 | Anderson et al. | ...... 219/121.57 |
| 6,296,742 B1 | 10/2001 | Kouznetsov | |
| 6,522,076 B2 | * 2/2003 | Goedicke et al. | ........ 315/111.21 |
| 6,524,455 B1 | * 2/2003 | Sellers | .................. 204/298.08 |

OTHER PUBLICATIONS

Trehch filling by ionized metal physical vapor deposition; Junqing Lu and Mark J. Kushner.

Anovel pulsed magnetron sputter technique utilizing high target power densities; Vladimir Kouznetsov etal.

Ionized sputter deposition using an extremely high plasma density pulsed magnetron discharge Karol Macak, et al.

Evolution of the electron distribution and plasma parameters in a pulse magnetron discharge J.T. Gudmundsson.

Influenceeof high power densities on the composition of pulsed magnetron plasmas A.P. Ehiasarian et al.

Novel metallization technique for filling 100 nm wide trenches and vias with very high aspect ratio Othon R. Monteiro.

* cited by examiner

Primary Examiner—Rodney G. McDonald
(74) Attorney, Agent, or Firm—Benjamin Hudson, Jr.

(57) ABSTRACT

There is provided by this invention novel magnetron sputtering apparatus that is generally comprised of a pulsed dc power supply capable of delivering peak powers of 0.1 megaWatts to several megaWatts with a peak power density greater than 1 kW/cm2. The power supply has a pulsing circuit comprised of an energy storage capacitor and serially connected inductor with a switching means for disconnecting the pulsing circuit from the plasma and recycling the inductor energy back to the energy storage capacitor at the detection of an arc condition. The energy storage capacitor and the serially connected inductor provide an impedance match to the plasma, limits the current rate of rise and peak magnitude in the event of an arc, and shapes the voltage pulses to the plasma.

7 Claims, 3 Drawing Sheets

HIGH PEAK POWER PLASMA PULSED SUPPLY WITH ARC HANDLING

BACKGROUND OF THE INVENTION

1. Field of the Invention

This invention is related generally to apparatus and methods for magnetron sputtering of highly ionized, high-density metal plasmas, and more particularly to magnetron sputtering apparatus that delivers peak powers of 0.1 mega Watts to several mega Watts, with peak power density of 1 kW/cm$^2$ and higher to a sputtering magnetron plasma load with arc handling capability.

2. Brief Description of the Prior Art

It is desirable to coat some substrates by generating metal ions and attracting the ions to the work piece by means of an electrical bias, which attracts the ions. The utility of this approach includes application of coatings to surfaces with irregularities that would prevent uniform deposition by normal sputtering, which essentially requires line of sight. Indeed coating and even filling high aspect ratio trenches in semiconductor devices is possible by biasing the wafer to attract the ions, as reported by Monteiro in JVST B 17(3), 1999 pg. 1094 and Lu and Kushner in JVST A 19(5), 2001 pg. 2652.

A technique for generating highly ionized, high density metal plasma by driving conventional sputtering magnetrons with electrical pulses having high peak power and low duty factor has been reported by Kouznetzov, et al. in Surface and Coatings Technology 122 (1999) pg. 290. Additional teachings can be found by Macak, et al, JVST A 18(4), 2000 pg. 1533; Gudmundsson, et al., APL, Vol. 78, No. 22, May 28, 2001, pg. 3427; and Ehiasarian, et al., Vacuum 65 (2002) p. 147, and U.S. Pat. No. 6,296,742 B1, Oct. 2, 2001.

The appeal of this technique is the ability to generate a large population of ionized species that can in turn be attracted to the work piece by the application of a bias voltage. The above references on the high peak power technique appear to use a simple capacitor discharge through an inductor. However, the technique taught by these references does not disclose any arc handling capability, and in fact suggests that an arc free region actually exists. Unavoidable imperfections in hardware make the physical realization of a completely arc free region of operation essentially impossible, even if its existence is suggested by theory. Use of the technique without arc handling capability makes commercial utilization impractical. Thus, it would be desirable to provide apparatus that enables commercial processes using high peak power pulses to magnetrons to produce high density, highly ionized metal plasmas by minimizing arc energy that in turn keeps product and target damage due to arcing within acceptable limits.

Typically arc control and arc diverting apparatus have been comprised of circuits that either detect the arc and disconnect the power supply from the load or are comprised of a switching circuit that effectively short circuits the power supply to extinguish the arc. These types of arc handling methods are very costly because they may result in a complete shut down of the process wasting expensive stock material, or require dissipation of energy stored in the power supply circuits. In high power applications short circuits to the power supply may result in extremely high currents that can cause destruction of the power supply itself, and repetitive dissipation of stored energy requires expensive resistive elements capable of high peak power and high average power, as well as the means for cooling them.

It would also be desirable if there were provided a magnetron sputtering apparatus and method that could deliver peak powers of 1 mega Watt or greater with arc handling capability for high yield commercial applications. It is an object of this invention to provide a magnetron sputtering plasma system that has the capability to detect arcs and take action to limit the energy delivered to the arc.

SUMMARY OF THE INVENTION

There is provided by this invention an apparatus and method for producing a high voltage pulse suited for delivering high peak power to high-density magnetron plasmas with efficient arc handling capability. A pulsing circuit comprised of an energy storage capacitor is repetitively charged and then discharged through an inductor in series with the plasma. The combination of the inductor and capacitor serve to shape the pulse, to provide an impedance match to the plasma, and to limit the current rate of rise and peak magnitude in the event of an arc. An arc is detected by either the fall of the discharge voltage below a preset voltage threshold during a pulse, or an increase in discharge current above a preset current threshold. When an arc is detected the energy storage capacitor is disconnected from the series inductor to stop the current rise. The pulsing circuit is then disconnected from the plasma load and the inductor energy is recycled to the energy storage capacitor.

BRIEF DESCRIPTION OF THE PREFERRED EMBODIMENTS

Figure 1:
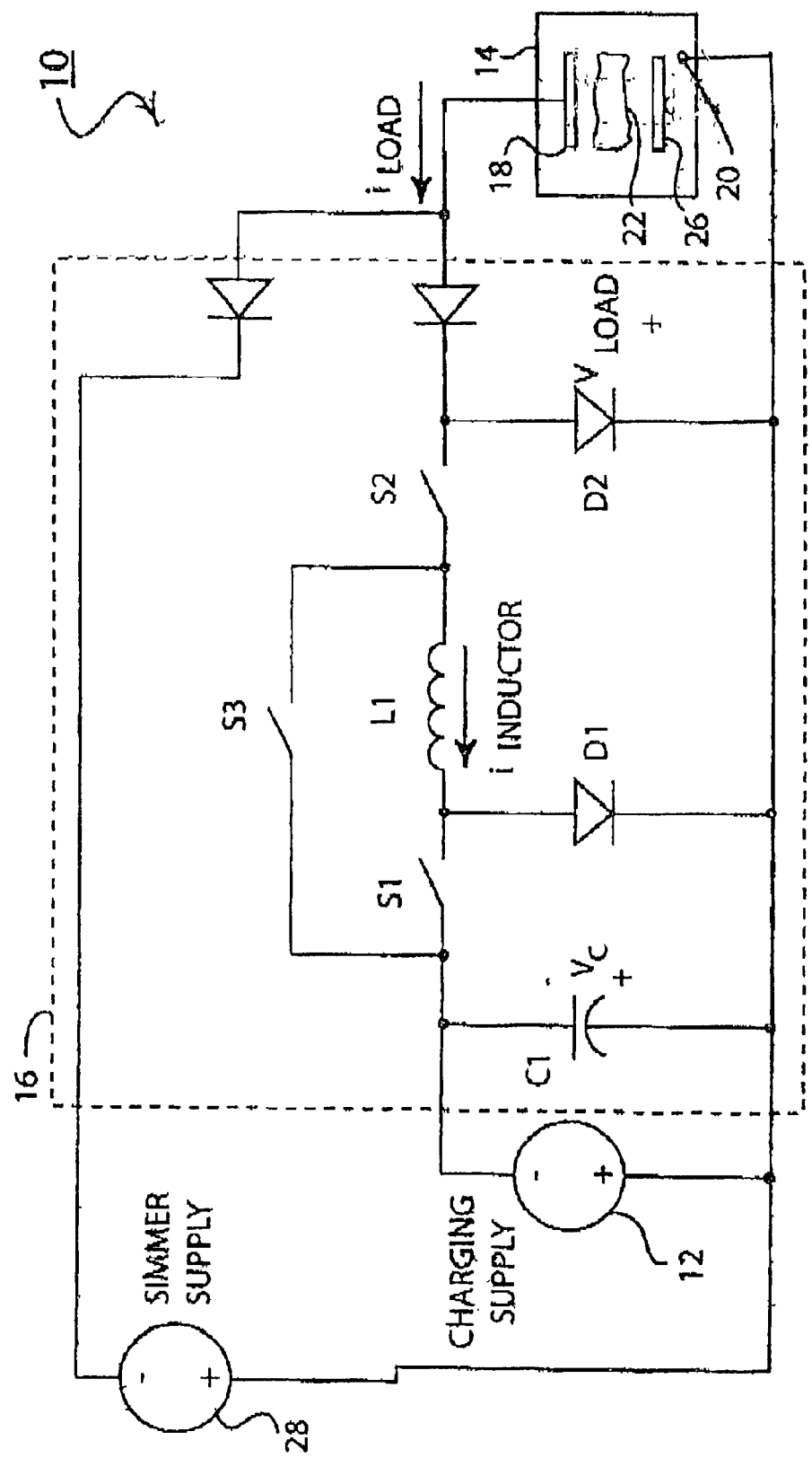
FIG. 1 is a schematic representation of a magnetron plasma processing system incorporating the principles of this invention.

Referring to FIG. 1 there is shown a magnetron plasma processing system 10. A dc power supply 12 is connected to a magnetron plasma-processing chamber 14 via a pulsing circuit 16. The magnetron plasma-processing chamber may be a conventional magnetron chamber well known to those skilled in the art having a magnetron cathode 18 and an anode 20. The pulsed supply 16 may be of the type such as a MegaPulser™ model manufactured by Advanced Energy Industries, Inc. which supplies a high voltage pulse across the cathode 18 and anode 20 to ignite a plasma 22 between the electrodes in a manner well known to those skilled in the art. As with all conventional plasma processing chambers the plasma acts upon the material of the cathode 18 so as to result in a coating on a substrate 26 located within the chamber. It is generally known and well understood that at high voltages and with variances in the processing environment within the chamber, arc discharges can occur from the plasma 22 or cathode 18 to the anode 20. Also, connected to the magnetron plasma-processing chamber is a smaller dc power supply 28 that maintains a minimum voltage to the magnetron to keep the plasma ignited between the high voltage pulses from the pulse circuit 16. This power supply may also be used to initially ignite the plasma before the high pulse operation begins.

For application of high voltage pulses to the magnetron processing chamber the pulsing circuit 16 is comprised of energy storage capacitor $C_1$ serially connected to an inductor $L_1$ via switch $S_1$. The inductor $L_1$ is connected to the cathode of the magnetron via switch $S_2$.

Figure 2:
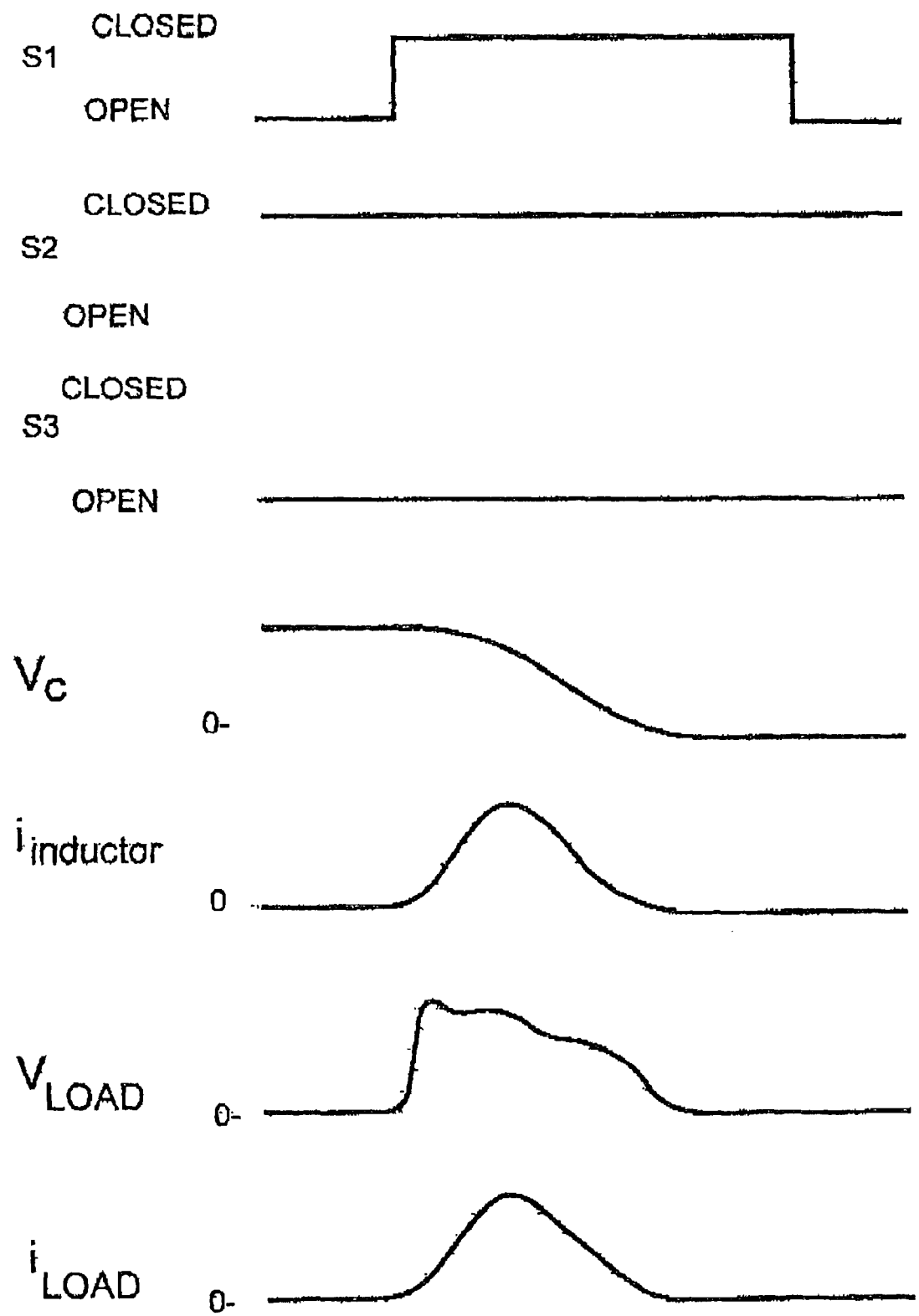
FIG. 2 illustrates the waveforms for normal operation of the magnetron plasma processing system shown in FIG. 1.

FIG. 2 illustrates the waveforms for normal operation of the circuit. $S_2$ is closed and $S_3$ are open for the whole sequence. The capacitor $C_1$ is charged to its initial voltage by the dc power supply 12. The discharge is initiated by $S_1$, and capacitor $C_1$ is discharged through inductor $L_1$ into the plasma load. A control circuit initiates the timing of the switches to control the charge time of the capacitor $C_1$ and its pulse discharge to the load. The shapes of the $V_C$, $i_{inductor}$, $V_{LOAD}$, and $I_{load}$ waveforms are determined solely by the initial value of $V_C$, the values of $C_1$ and $L_1$ and the characteristics of the plasma load and the output cable.

Figure 3:
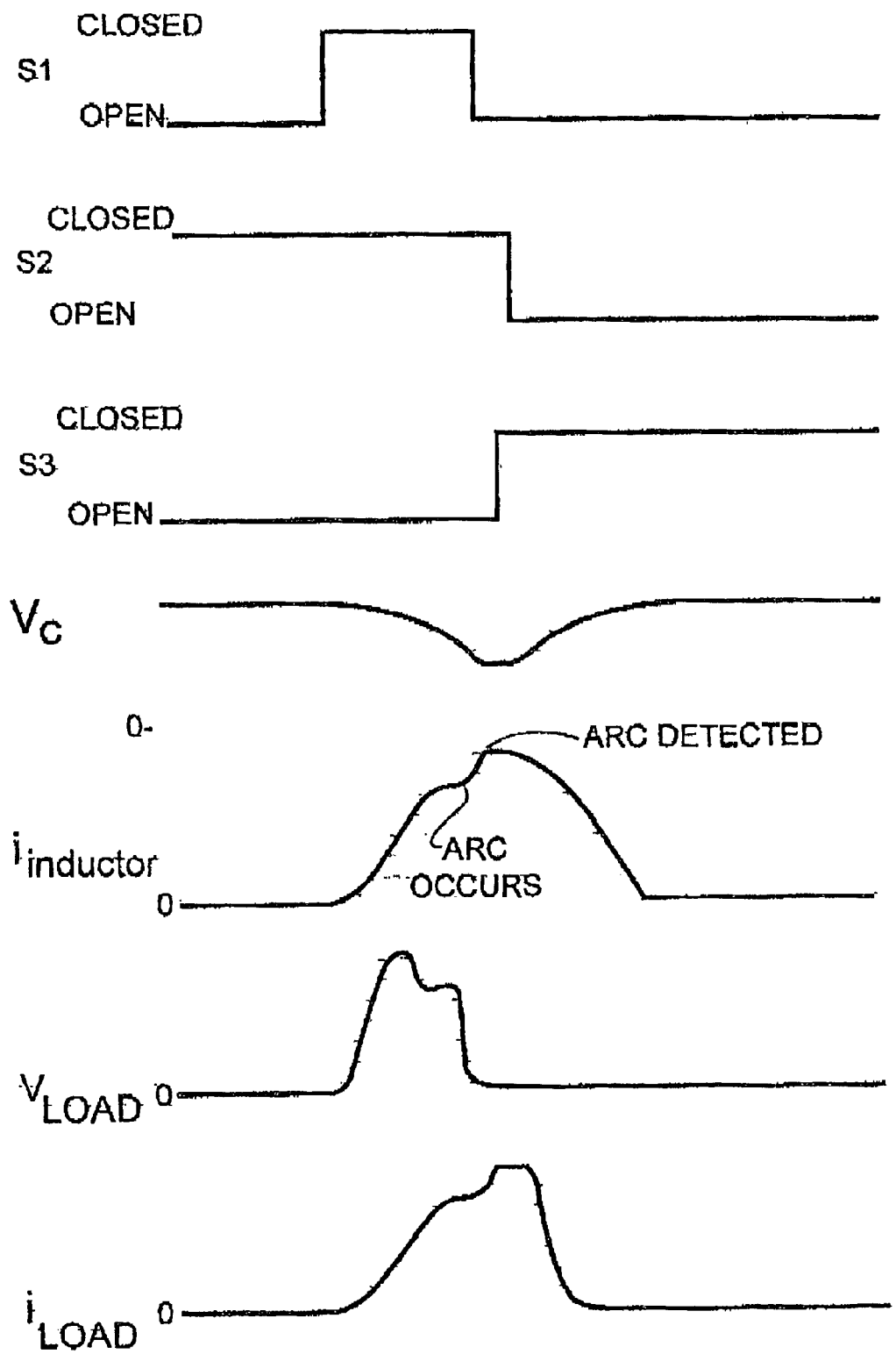
FIG. 3 illustrates the waveforms for arc handling operation.

FIG. 3 shows waveforms representative of an arc occurring during a pulse from the pulsing circuit 16. The sequence begins as shown in FIG. 2 and described above, but when an arc occurs the current rises and the voltage falls until the arc is detected. Arcs are detected by one of two means. Specific circuit techniques required to implement the arc detection means are well known to those skilled in the art. First, an arc may be detected as the load current exceeding a preset threshold. This threshold can actually be updated on a pulse by pulse basis by predicting the output current, based on plasma load characteristics and the initial value of $V_C$ and the values of $C_1$ and $L_1$ and adding a margin to prevent false detections. Prediction of the output current based on these parameters is well known to those skilled in the art. Alternately, the current threshold may be based on the average peak current, with some margin added to prevent false arc detections. In this case, it may be desirable to leave pulses with high arc currents out of the average calculation. Second, an arc may be detected as the load voltage being below a preset threshold when the load current is above a second current threshold, used only for this second method. When the arc is detected, $S_1$ is opened immediately and $S_3$ is closed after a short delay, and then $S_2$ is opened after another short delay. This disconnects the load from the pulse circuit 16 and initiates the resonant transfer of energy from inductor $L_1$ to capacitor $C_1$. The result is that the energy present in inductor $L_1$ when the arc occurred is recycled to capacitor $C_1$. This arc handling sequence minimizes the energy delivered to the load in the event of an arc. Without the arc handling provisions, the energy stored in $C_1$ and the energy stored in $L_1$ would be delivered to the arc, almost certainly causing damage to the target and the work piece. Arc handling provisions enable commercial use of this process.

It can be readily seen that there is provided a novel high peak power plasma pulsed supply for pulsed magnetrons with arc handling that minimizes damage due to arcs by disconnecting the pulsing circuit from the plasma load and recycling the inductor energy stored for the high peak power pulse back to the energy storage capacitor at the detection of an arc condition.

Although there is illustrated and described specific structure and details of operation, it is clearly understood that the same were merely for purposes of illustration and that changes and modifications may be readily made therein by those skilled in the art without departing from the spirit and the scope of this invention.

I claim:

1. Apparatus for sputter deposition of a cathode material in a continuous operating mode to form a coating on a substrate, comprising:
    a) a plasma chamber in which a plasma is created containing ions and electrons;
    b) at least one target disposed in the plasma chamber containing atoms that can be sputtered there from in response to bombardment by ions from the plasma to deposit a film on the surface of at least one substrate in close proximity to the plasma;
    c) a dc pulsed power supply having a pulsing circuit connected to the target disposed in the plasma chamber to deliver voltage pulses thereto; and
    d) the pulsing circuit further comprising an energy storage capacitor for delivering the pulses to a serially connected inductor with a switching means for disconnecting the pulsing circuit from the plasma and recycling the inductor energy back to the energy storage capacitor at the detection of an arc condition.

2. Apparatus for sputter deposition of a cathode material in a continuous operating mode to form a coating on a substrate as recited in claim 1 wherein the energy storage capacitor and the serially connected inductor provide an impedance match to the plasma.

3. Apparatus for sputter deposition of a cathode material in a continuous operating mode to form a coating on a substrata as recited in claim 2 wherein the energy storage capacitor and the serially connected inductor limit the current rate of rise and peak magnitude in the event of an arc.

4. Apparatus for sputter deposition of a cathode material in a continuous operating mode to form a coating on a substrate as recited in claim 3 wherein the energy storage capacitor and the serially connected inductor shape the voltage pulses.

5. Apparatus for sputter deposition of a cathode material-in a continuous operating mode to form a coating on a substrate as recited in claim 4 wherein the dc pulsed power supply delivers power of 0.1 mega Watts to several mega Watts with a peak power density greater than 1 $kW/cm^2$.

6. Apparatus for sputter deposition of a cathode material in a continuous operating mode to form a coating on a substrate as recited in claim 1 wherein the pulsing circuit updates arc current threshold based on initial charge voltage at beginning of discharge of the energy storage capacitor, the values of the inductor and the capacitor, and plasma load characteristics.

7. Apparatus for sputter deposition of a cathode material in a continuous operating mode to form a coating on a substrate as recited in claim 1 wherein the pulsing circuit updates arc current threshold based on average peak current with pulses having high arc currents excluded from the calculation.

* * * * *